(12) United States Patent
Chang et al.

(10) Patent No.: US 11,778,867 B2
(45) Date of Patent: Oct. 3, 2023

(54) DISPLAY PANEL

(71) Applicant: Au Optronics Corporation, Hsinchu (TW)

(72) Inventors: Kuo-Jui Chang, Hsinchu (TW); Wen-Tai Chen, Hsinchu (TW); Chi-Sheng Chiang, Hsinchu (TW); Chien-Sen Weng, Hsinchu (TW); Ming-Wei Sun, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 219 days.

(21) Appl. No.: 17/384,815

(22) Filed: Jul. 26, 2021

(65) Prior Publication Data

US 2022/0262875 A1 Aug. 18, 2022

(30) Foreign Application Priority Data

Feb. 17, 2021 (TW) ................ 110105407

(51) Int. Cl.
*H01L 27/32* (2006.01)
*H10K 59/122* (2023.01)
*H10K 50/84* (2023.01)
*H10K 59/121* (2023.01)

(52) U.S. Cl.
CPC .......... *H10K 59/122* (2023.02); *H10K 50/84* (2023.02); *H10K 59/121* (2023.02)

(58) Field of Classification Search
CPC .... H10K 59/122; H10K 50/84; H10K 59/121; H10K 59/12; H10K 50/8428; H01L 51/525; H01L 27/3244; H01L 27/3246; H01L 27/326; H01L 51/5237

USPC .......................................................... 257/40
See application file for complete search history.

(56) References Cited

U.S. PATENT DOCUMENTS

| | | | |
|---|---|---|---|
| 7,365,367 B2 | 4/2008 | Han et al. | |
| 9,768,382 B2 | 9/2017 | Wang et al. | |
| 10,056,440 B2 | 8/2018 | Im et al. | |
| 10,446,627 B2 | 10/2019 | Im et al. | |
| 10,644,075 B2* | 5/2020 | Gong | H10K 59/1216 |
| 2004/0119066 A1 | 6/2004 | Han et al. | |
| 2009/0160322 A1* | 6/2009 | Yoshida | H10K 59/173 |
| | | | 313/504 |
| 2016/0351638 A1 | 12/2016 | Im et al. | |
| 2016/0359112 A1* | 12/2016 | Wang | H10K 59/122 |
| 2018/0323244 A1 | 11/2018 | Im et al. | |
| 2019/0237703 A1* | 8/2019 | Kim | H10K 59/122 |

(Continued)

FOREIGN PATENT DOCUMENTS

| | | |
|---|---|---|
| CN | 1499907 | 5/2004 |
| CN | 104465671 | 3/2015 |

(Continued)

*Primary Examiner* — Benjamin P Sandvik
(74) *Attorney, Agent, or Firm* — JCIPRNET

(57) ABSTRACT

A display panel includes a substrate, a first isolation structure, a second isolation structure and a plurality of light emitting structures. The first isolation structure is disposed on the substrate and includes a plurality of through holes. The second isolation substrate is laminated on the first isolation substrate and fills up the plurality of through holes of the first isolation substrate. The plurality of light emitting structures are disposed on the substrate and are isolated from each other via the second isolation structure.

14 Claims, 13 Drawing Sheets

(56) References Cited

U.S. PATENT DOCUMENTS

2020/0127070 A1* 4/2020 Tang .................... H10K 50/824
2022/0352263 A1* 11/2022 Lee ...................... H10K 59/353

FOREIGN PATENT DOCUMENTS

CN       106206656      12/2016
CN       112420943 A * 2/2021

* cited by examiner

DISPLAY PANEL

CROSS-REFERENCE TO RELATED APPLICATION

This application claims the priority benefit of Taiwan application serial no. 110105407, filed on Feb. 17, 2021. The entirety of the above-mentioned patent application is hereby incorporated by reference herein and made a part of this specification.

BACKGROUND

Technical Field

The disclosure relates to a panel, and particularly relates to a display panel.

Description of Related Art

A light emitting layer could be formed by using an ink-jet printing process in the manufacturing process of an organic light emitting diode display panel. The ink-jet printing process is performed by injecting the droplets into an opening defined by an isolation structure, thereby forming the light emitting layer. However, the problem of peel is easily generated when the adhesion between the isolation structure and a substrate is poor. A width of the isolation structure could be decreased to make the display panel have a high-resolution; however, the risk pertaining the peel of the isolation structure would be further increased.

SUMMARY

The disclosure provides a display panel, which can enhance the adhesion between an isolation structure and a substrate, thereby preventing the isolation structure from being peeled from the substrate.

According to an embodiment of the disclosure, a display panel comprising a substrate, a first isolation structure, a second isolation structure, and a plurality of light emitting structures. The first isolation structure is disposed on the substrate and has a plurality of through holes. The second isolation structure is laminated on the first isolation structure and fills up the plurality of through holes of the first isolation structure. The plurality of light emitting structures are disposed on the substrate and are isolated from each other via the second isolation structure.

In an embodiment of the disclosure, a material of the first isolation structure includes an inorganic material or an organic material.

In an embodiment of the disclosure, a material of the second isolation structure includes an organic material.

In an embodiment of the disclosure, a width of the second isolation structure measured along a selected direction is larger than a width of the first isolation structure measured along the selected direction.

In an embodiment of the disclosure, the second isolation structure covers a side surface of the first isolation structure.

In an embodiment of the disclosure, a width of the second isolation structure measured along a selected direction is smaller than a width of the first isolation structure measured along the selected direction.

In an embodiment of the disclosure, a width of the second isolation structure measured along a selected direction is the same as a width of the first isolation structure measured along the selected direction.

In an embodiment of the disclosure, the first isolation structure extends along a first direction, the second isolation structure extends along a second direction, and the first direction intersects the second direction.

In an embodiment of the disclosure, an extension direction of the first isolation structure is the same as an extension direction of the second isolation structure.

In an embodiment of the disclosure, the first isolation structure includes a first direction portion extending along a first direction and a second direction portion extending along a second direction, the first direction intersects the second direction, and the plurality of through holes are disposed in the second direction portion.

In an embodiment of the disclosure, the second isolation structure is laminated on the second direction portion and extends along the second direction.

In an embodiment of the disclosure, a surface of the second isolation structure has hydrophobicity.

In an embodiment of the disclosure, the plurality of through holes penetrate the first isolation structure.

In an embodiment of the disclosure, the light emitting structure includes an organic light emitting laminated layer.

In an embodiment of the disclosure, a top surface of the second isolation structure is farther away from the substrate compared to a top surface of the first isolation structure.

Based on the above, the display panel of the embodiment of the present disclosure adopts the design of the plurality of isolation structures. Therefore, the adhesion between the first isolation structure as well as the second isolation structure and the substrate could be enhanced by forming the plurality of through holes in the first isolation structure and laminating the second isolation structure filling up the plurality of through holes on the first isolation structure, thereby preventing the first isolation structure and the second isolation structure from being peeled from the substrate.

To make the aforementioned more comprehensible, several embodiments accompanied with drawings are described in detail as follows.

DESCRIPTION OF THE EMBODIMENTS

Figure 1:
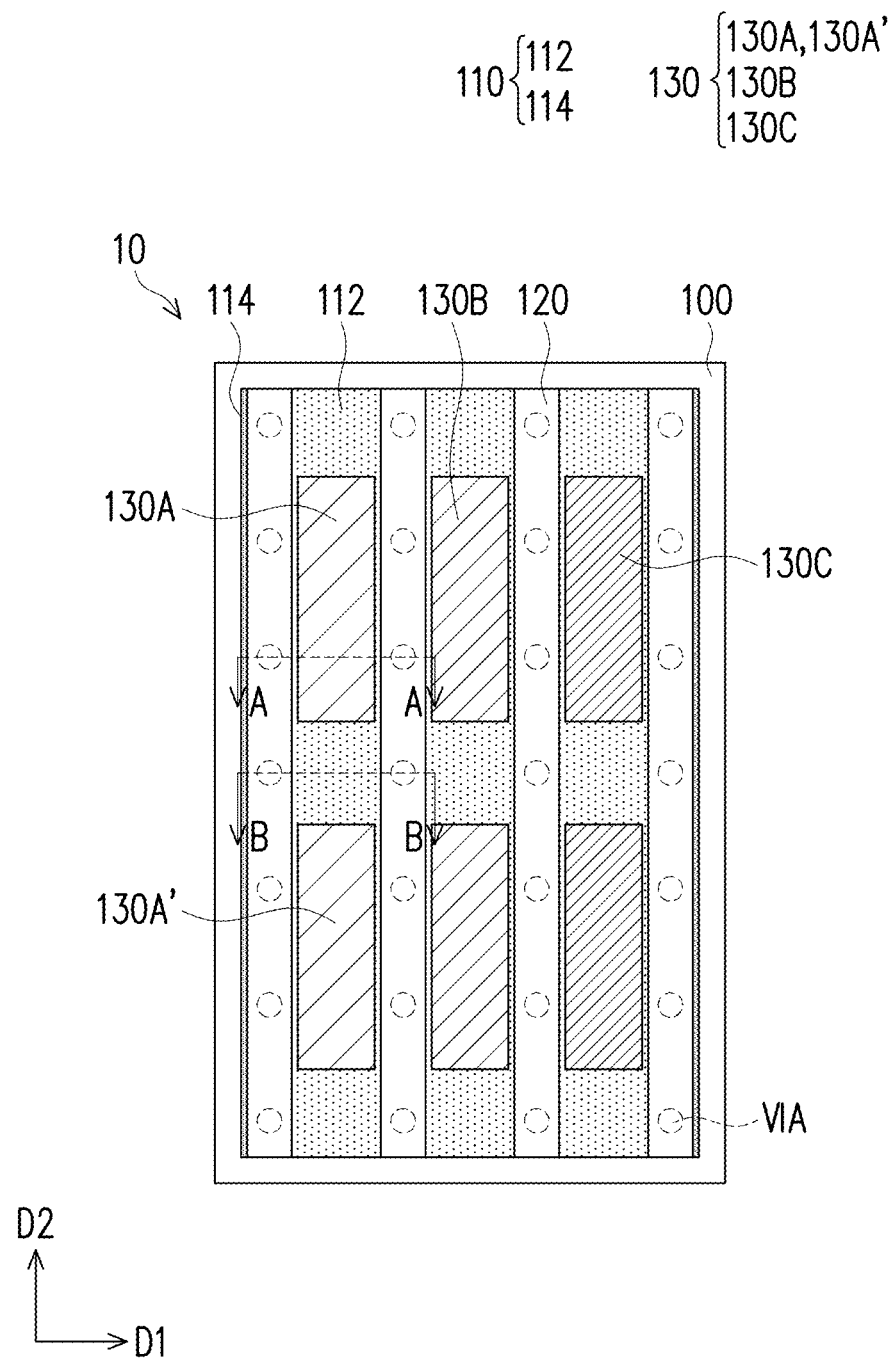
FIG. 1 is a partial top schematic view of a display panel according to an embodiment of the disclosure.

Throughout the specification, the same reference numerals in the accompanying drawings denote the same or similar elements. In the accompanying drawings, thicknesses of layers, films, panels, regions and so on are exaggerated for clarity. It should be understood that when an element such as a layer, film, region, or substrate is referred to as being "on" or "connected to" another element, it can be directly on or connected to the other element, or intervening elements may also be present between said element and said another element. In contrast, when an element is referred to as being "directly on" or "directly connected to" another element, there are no intervening elements present between said element and said another element. As used herein, the term "connected" may refer to physically connected and/or electrically connected. Therefore, intervening elements may be present between two elements when the two elements are "electrically connected" or "coupled" to each other.

It should be understood that, although the terms "first", "second", etc., may be used herein to describe various elements, components, regions, layers and/or sections, these elements, components, regions, layers, and/or sections should not be limited by these terms. These terms are used to distinguish one element, component, region, layer or section from another element, component, region, layer or section. Therefore, "a first element", "a first component", "a first region", "a first layer" or "a first section" discussed below could also be seen as "a second component", "a second region", "a second layer" or "a second section", which do not extend beyond the spirits of the disclosure.

The terminology used herein is for the purpose of describing particular embodiments and is not intended to be limiting of the disclosure. As used herein, the singular forms "a", "an" and "the" are intended to include the plural forms as well, unless the context clearly indicates otherwise. Herein, "or" represents "and/or". The term "and/or" used herein includes any or a combination of one or more of the associated listed items. It will be further understood that the terms "comprise", "comprising", "include" and/or "comprising", when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "below" or "bottom" and "above" or "top" may serve to describe the relation between one element and another element in the text according to the illustration of the drawings. It should also be understood that the relative terms are intended to include different orientations of a device in addition to the orientation shown in the drawings. For example, if a device in the drawings is flipped, an element described as being disposed "below" other elements shall be re-orientated to be "above" other elements. Thus, the exemplary term "below" may cover the orientations of "below" and "above", depending on a specific orientation of the drawings. Similarly, if a device in a figure is flipped over, the element originally described to be located "below" or "underneath" other element is oriented to be located "on" the other element. Therefore, the illustrative term "under" or "below" may include orientations of "above" and "under".

Unless otherwise defined, all terms (comprising technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

A schematic view of a cross-sectional figure is used as an ideal embodiment to describe the disclosure. Therefore, the figure used as the result of the manufacturing technology and/or tolerance changed in shape could be expected. However, it should be understood that the embodiment recited in the description should not be used to be interpreted as a limitation of the specific shape of the region shown in the figure, while there includes a tolerance in shape caused by a fabrication, for example. Moreover, an acute angle could be round. Therefore, the region shown in the figure is substantially schematic, and its shape is not used to intent to describe the specific shape and limit the scope of the claims.

Figure 2:
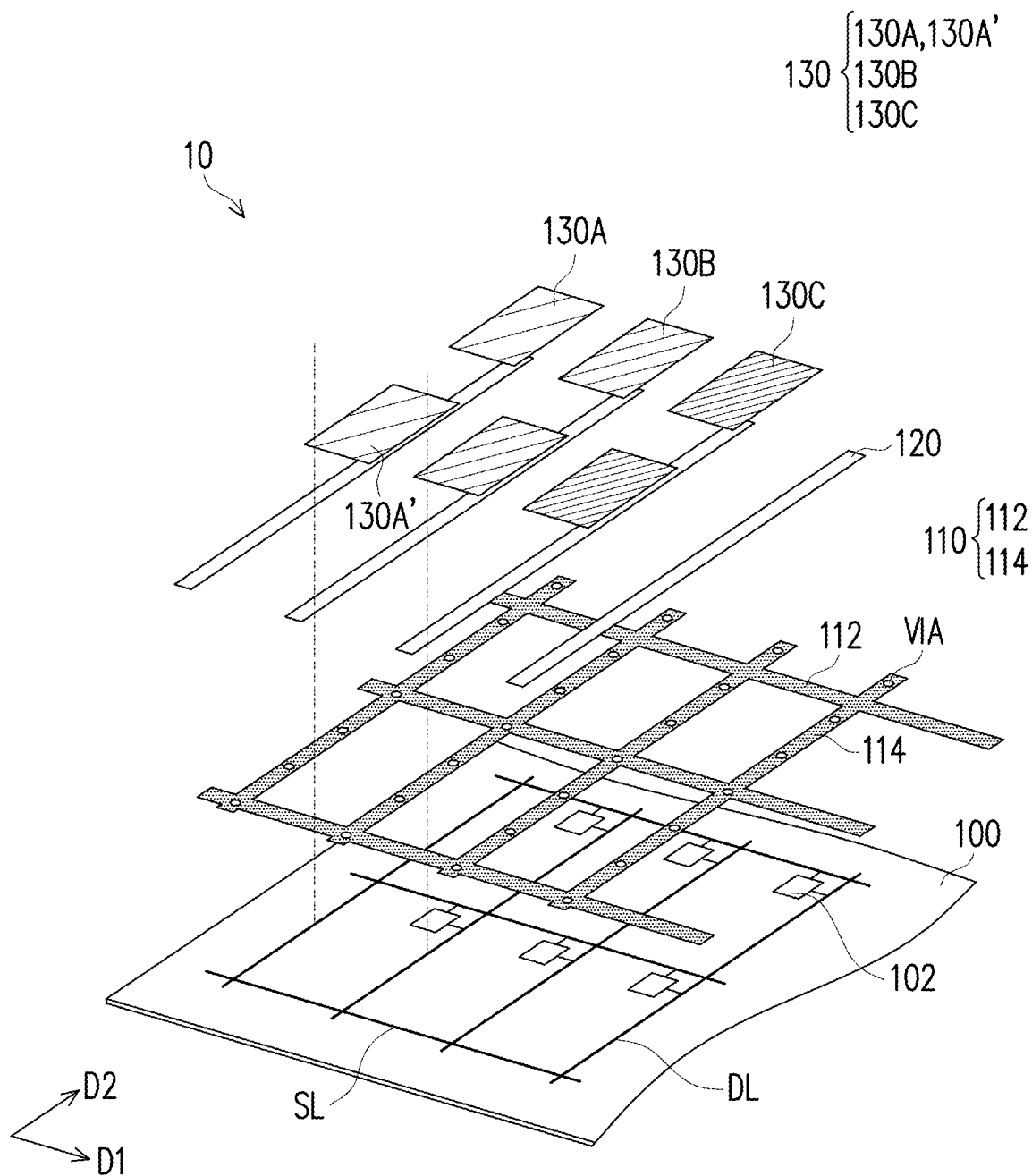
FIG. 2 is an exploded view of a partial component of the display panel shown in FIG. 1.

FIG. 1 is a partial top schematic view of a display panel according to an embodiment of the disclosure. FIG. 2 is an exploded view of a partial component of the display panel shown in FIG. 1. In order to clearly demonstrate the relationship between a first isolation structure and a second isolation structure, there are only the first isolation structure, the second isolation structure, a plurality of light emitting structures, and a substrate shown in FIG. 1, while other related components of the display panel could be referenced from the exploded view shown in FIG. 2.

With reference to FIG. 1 and FIG. 2, a display panel 10 includes a first isolation structure 110, a second isolation structure 120, and a plurality of light emitting structures 130. The first isolation structure 110 is located on a substrate 100 and has a plurality of through holes VIA. The first isolation structure 110 could be a reticular structure or a plurality of banned structures extending along a specific direction; however, which should not be construed as a limitation in the disclosure. The second isolation structure 120 could be a plurality of banned structures extending along a specific direction, and laminated on the first isolation structure 110 as well as fills up the plurality of through holes VIA of the first isolation structure 110. The plurality of light emitting structures 130 are disposed on the substrate 100 and is arranged in an array, and are isolated from each other via the second isolation structure 120. In some embodiments, the second isolation structure 120 could also be a reticular structure.

A material of the substrate 100 could be a glass or a polymer; however, which should not be construed as a limitation in the disclosure. There could be an electrical circuit component used to achieve the effect of display or transport the electrical signal disposed on the substrate 100. For example, a plurality of scan lines SL extending along a first direction D1 or a plurality of data lines DL extending along a second direction D2 are disposed on the substrate 100, wherein the first direction D1 intersects the second direction D2. In some embodiments, the first direction D1 and the second direction D2 could be orthogonal, while the first direction D1 could also intersects the second direction D2 at other angles. The plurality of data lines DL are arranged along the first direction D1 and the plurality of scan lines SL are arranged along the second direction D2. A plurality of pixel circuits 102 arranged in an array could be further disposed on the substrate 100, wherein the plurality of pixel circuits 102 extend along the first direction D1 and the second direction D2 to be arrange in an array, and each pixel circuit 102 is electrically connected to one of the plurality of scan lines SL and one of the plurality of data lines DL. Each pixel circuit 102 could include at least one transistor, and could further include at least one capacitor structure. In some embodiments, a power supply line, a common signal line and other signal lines could be further disposed on the substrate 100, which are used to supply a power signal and a common signal to the pixel circuit 102.

With reference to FIG. 2, the first isolation structure 110 is the reticular structure, and includes a first direction portion 112 extending along the first direction D1 and a second direction portion 114 extending along the second direction D2, wherein the first direction portion 112 could correspond to and overlap the plurality of scan lines SL, and the second direction portion 114 could correspond to and overlap the plurality of data lines DL; however, which should not be construed as a limitation in the disclosure. The second direction portion 114 of the first isolation structure 110 has the plurality of through holes VIA. The second isolation structure 120 is a banned structure arranging along the first direction D1 and extending along the second direction D2, which is laminated on the second direction portion 114 of the first isolation structure 110 and overlaps the second direction portion 114, and fills up the plurality of through holes VIA of the second direction portion 114. Namely, the second isolation structure 120 could also correspond to and overlap the plurality of data lines DL.

The plurality of light emitting structures 130 arrange in an array along the first direction D1 and the second direction D2, and are electrically connected to the pixel circuit 102, respectively. The plurality of light emitting structures 130 could be electrically connected to one of the plurality of scan lines SL and one of the plurality of data lines DL via the pixel circuit 102. The plurality of light emitting structures 130 (for example, a light emitting structure 130A and a light emitting structure 130A') electrically connected to the same data line DL could emit light with the same color. Namely, the different light emitting structures 130 arrange in the same column along the second direction D2 could emit light with the same color. The neighbor light emitting structures 130 (for example, the light emitting structure 130A and the light emitting structure 130A') arranging in the same column could be isolated from each other via the first direction portion 112 of the first isolation structure 110. The plurality of light emitting structures 130 (for example, the light emitting structure 130A, a light emitting structure 130B and a light emitting structure 130C) electrically connected to the same scan line SL could emit light with the different color. Namely, the different light emitting structures 130 arrange in the same row along the first direction D1 could emit light with the different color. The neighbor light emitting structures 130 (for example, the light emitting structure 130A, the light emitting structure 130B and the light emitting structure 130C) arranging in the same row along the first direction D1 could be isolated from each other via the second direction portion 114 of the first isolation structure 110 and the second isolation structure 120.

Figure 3:
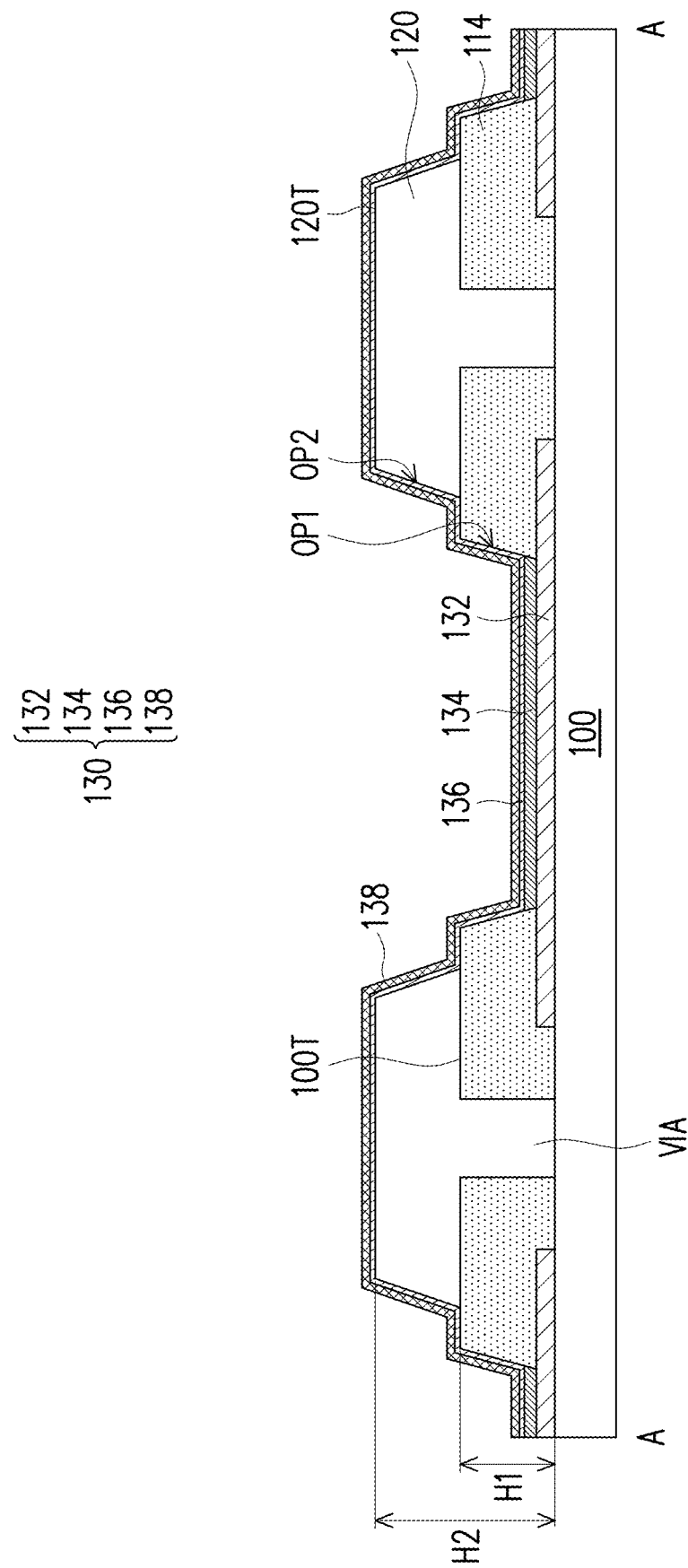
FIG. 3 is a cross-sectional view according to an embodiment of the display panel shown in FIG. 1 along a section-line A-A.

FIG. 3 is a cross-sectional view according to an embodiment of the display panel shown in FIG. 1 along a section-line A-A. The pixel circuit 102, the data line DL, the scan line SL and other components are omitted in FIG. 3 to clearly demonstrate the relationship between the light emitting structure 130 and the first isolation structure 110 as well as the second isolation structure 120.

With reference to FIG. 1 and FIG. 3, the light emitting structure 130 could include an anode 132, an organic light emitting laminated layer 134, a cathode 136, and a cover layer 138. The anode 132 of the light emitting structure 130 is disposed on the substrate 100, the first isolation structure 110 is located on the substrate 100 and partially overlaps the anode 132, wherein the isolation structure 110 has a first opening OP1 exposing a surface of the anode 132. The second isolation structure 120 is laminated on the first isolation structure 110 and has a second opening OP2 overlapping the first opening OP1. Namely, a portion of the surface of the anode 132 could be exposed via the first opening OP1 and the second opening OP2. The second direction portion 114 of the first isolation structure 110 further includes the plurality of through holes VIA, the plurality of through holes VIA penetrate the second direction portion 114 to expose the substrate 100, and be filled with the second isolation structure 120, so that the adhesion between the first isolation structure 110 as well as the second isolation structure 120 and the substrate 100 could be enhanced. The organic light emitting laminated layer 134 is located in the first opening OP1 and overlaps the portion of the surface of the anode 132. The organic light emitting laminated layer 134 could include a hole injection layer, a hole transport layer, a light emitting layer, an electron transport layer, an electron injection layer, and other layers disposed in the first opening OP1 in sequence; however, which should not be construed as a limitation in the disclosure. The cathode 136 and the cover layer 138 are disposed on the organic light emitting laminated layer 134 in sequence, and partially cover a top surface and a side surface of the first isolation structure 110 and the second isolation structure 120.

A material of the first isolation structure 110 could include an inorganic material or an organic material, and a material of the second isolation structure 120 could include an organic material. In addition, a surface of the second isolation structure 120 has hydrophobicity. The above inorganic material includes silicon oxide (SiOx), silicon nitride (SiNx), other oxides, other nitrides, or other suitable materials, which should not be construed as a limitation in the disclosure. The above organic material includes a photoresist material, a curable resin material or other suitable materials, which should not be construed as a limitation in the disclosure. A thickness (a vertical distance H1 between a top surface 110T of the first isolation structure 110 and the substrate 100) of the first isolation structure 110 could be 1000 Å ~5000 Å when the material of the first isolation structure 110 is the inorganic material, and a thickness (a vertical distance H1 between the top surface 110T of the first isolation structure 110 and the substrate 100) of the first isolation structure 110 could be 6000 Å ~12000 Å when the material of the first isolation structure 110 is the organic material. As shown in FIG. 3, a vertical distance H2 between a top surface 120T of the second isolation structure 120 and the substrate 100 is larger than the vertical distance H1 between the top surface 110T of the first isolation structure 110 and the substrate 100; that is, the top surface of the second isolation structure 120 is farther away from the substrate 100 when compared to the top surface of the first isolation structure 110. The different light emitting structures 130 arranging on the same row along the first direction D1 could be easily isolated from each other via the second isolation structure 120 when using the above design regarding the height, so that an organic light emitting material of the different light emitting structures 130 could be prevented from being mixed with each other, thereby decreasing the defect of color mixing in the display panel 10 and improving the effect of light emitting and display of the display panel 10.

For example, the organic light emitting laminated layer 134 of the light emitting structure 130 could be formed in the first opening OP1 by an ink-jet printing process after the anode 132, the first isolation structure 110, and the second isolation structure 120 are formed on the substrate 100. The ink-jet printing process is performed by spraying the organic light emitting material liquid in the different first openings OP1 in sequence and then curing the organic light emitting material liquid via a drying operation to form one layer of the organic light emitting laminated layer 134. Therefore, the desired organic light emitting laminated layer 134 is formed by repeating the above ink-jet printing process and the curing operation. The neighbor first openings OP1 arranging on the same column along the second direction D2 could be sprayed the same organic light emitting material, and the neighbor first openings OP1 arranging on the same row along the first direction D1 could be sprayed the different organic light emitting material. The different organic light emitting material in the neighbor first openings OP1 along the first direction D1 could be isolated from each other via the second isolation structure 120 since the top surface 120T of the second isolation structure 120 is farther away from the substrate 100 when compared to the top surface 110T of the first isolation structure 110, so that the different organic light emitting material in the different first openings OP1 could be prevented from being mixed with each other, thereby decreasing the defect of color mixing in the light emitting structures 130 formed in the following process.

In addition, the first isolation structure 110 and the second isolation structure 120 are combined with each other via the through hole VIA, so that the stability of the second isolation structure 120 is secured. For example, the second isolation structure 120 is not easily be peeled from the substrate 100, thereby improving the quality of the display panel 10.

Figure 4:
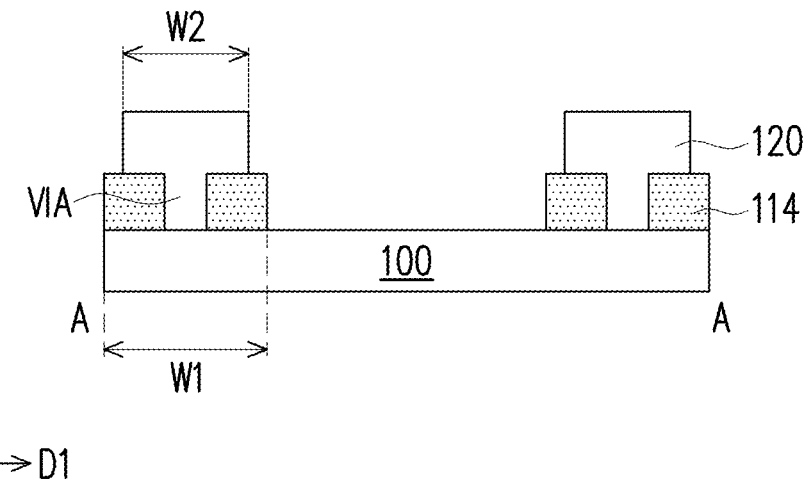
FIG. 4 is a cross-sectional view according to another embodiment of the display panel shown in FIG. 1 along the section-line A-A.
Figure 5:
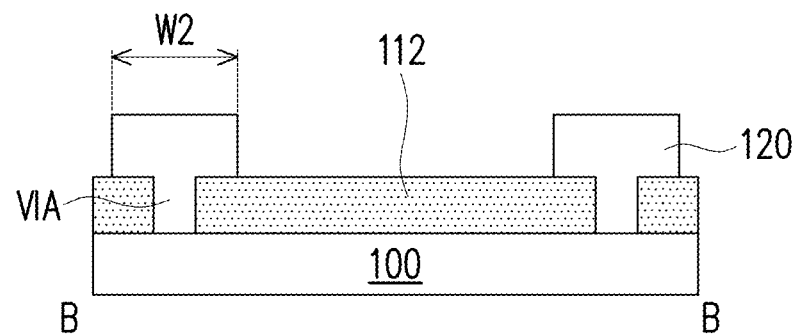
FIG. 5 is a cross-sectional view according to an embodiment of the display panel shown in FIG. 1 along a section-line B-B.

FIG. 4 is a cross-sectional view according to another embodiment of the display panel shown in FIG. 1 along the section-line A-A. FIG. 5 is a cross-sectional view according to an embodiment of the display panel shown in FIG. 1 along a section-line B-B. The first isolation structure, the second isolation structure and the substrate are only illustrated in FIG. 4 and FIG. 5 to clearly demonstrate the relationship between the components, while other components could be reference to the related description in FIG. 2 and FIG. 3.

In FIG. 4 and FIG. 5, a width W2 of the second isolation structure 120 measured along the first direction D1 is smaller than a width W1 of the second direction portion 114 of the first isolation structure 110 measured along the first direction D1. Therefore, a portion of a top surface of the second direction portion 114 and a side surface of the second direction portion 114 could be exposed by the second isolation structure 120 and not be covered by the second isolation structure 120.

Figure 6:
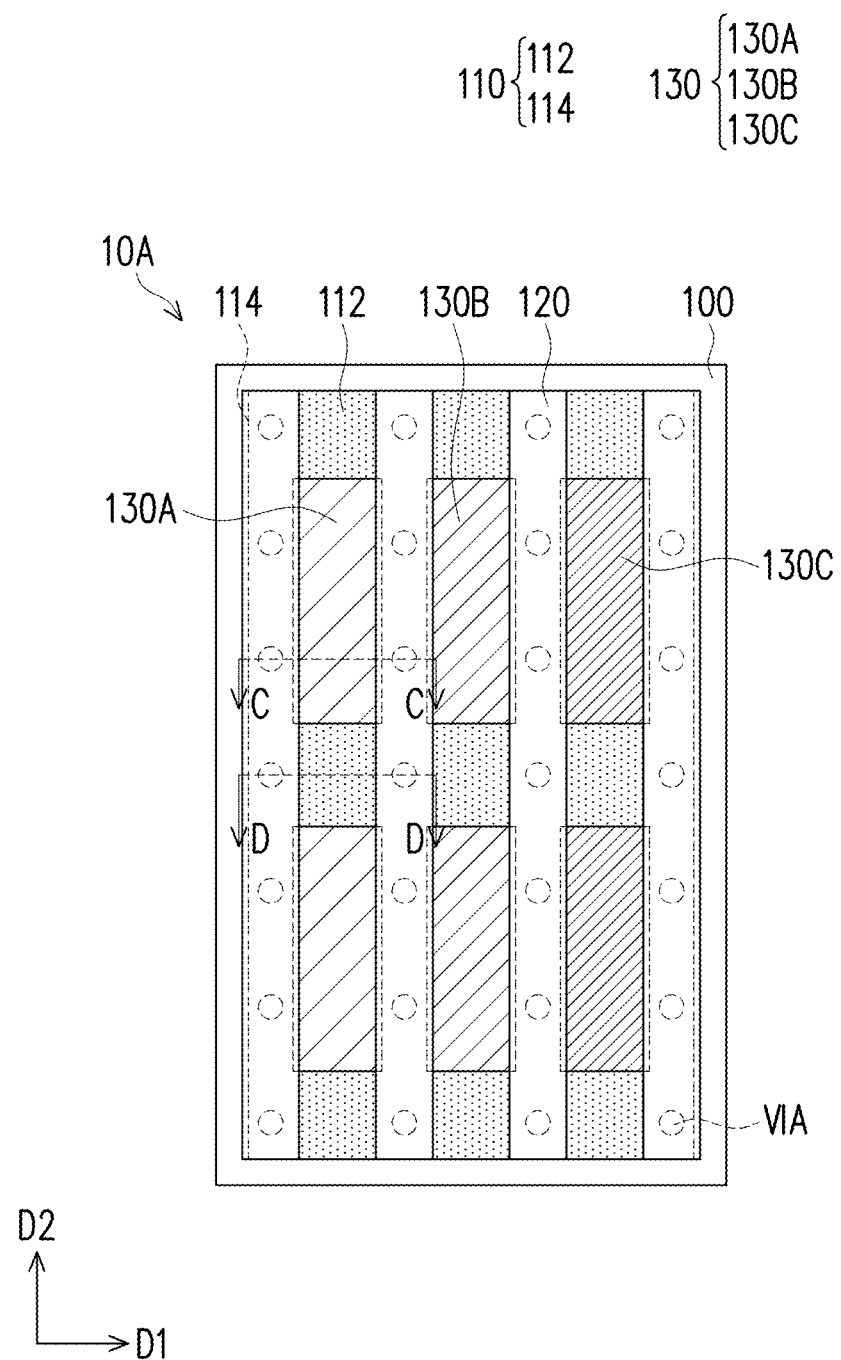
FIG. 6 is a partial top schematic view of a display panel according to another embodiment of the disclosure.
Figure 7:
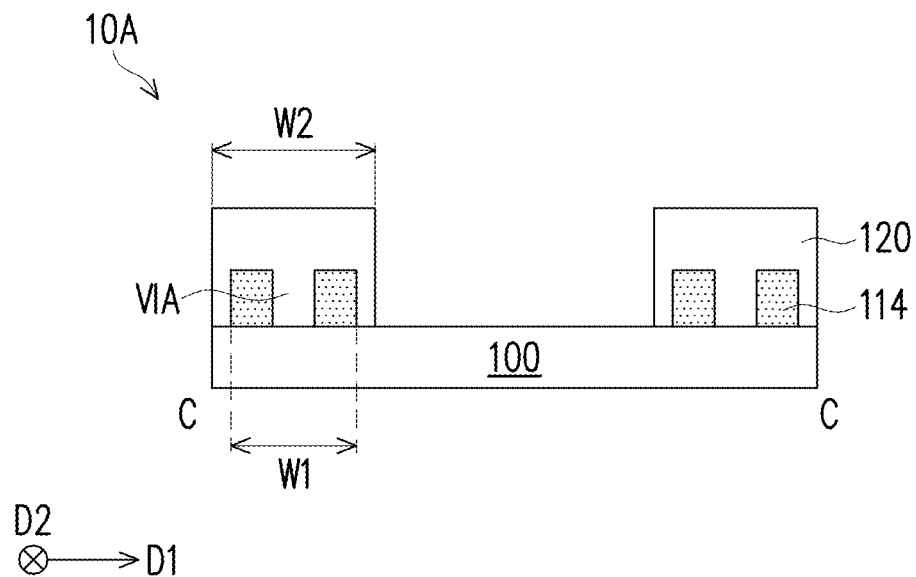
FIG. 7 is a cross-sectional view according to an embodiment of the display panel shown in FIG. 6 along a section-line C-C.
Figure 8:
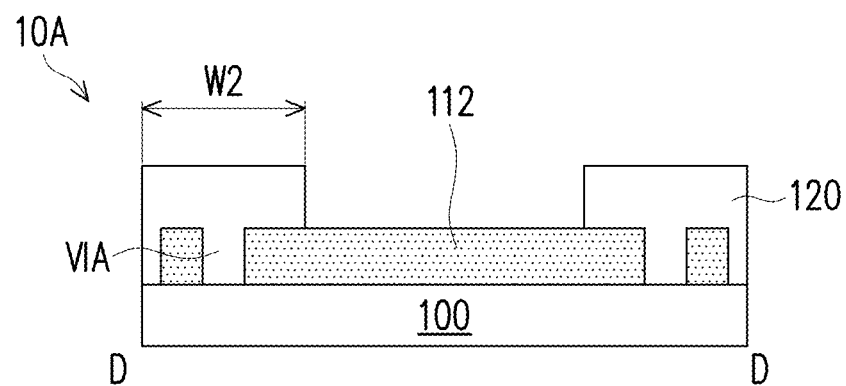
FIG. 8 is a cross-sectional view according to an embodiment of the display panel shown in FIG. 6 along a section-line D-D.

FIG. 6 is a partial top schematic view of a display panel 10A according to another embodiment of the disclosure. FIG. 7 is a cross-sectional view according to an embodiment of the display panel 10A shown in FIG. 6 along a section-line C-C. FIG. 8 is a cross-sectional view according to an embodiment of the display panel 10A shown in FIG. 6 along a section-line D-D. In order to clearly demonstrate the relationship between the components, there are only the first isolation structure, the second isolation structure, and the substrate shown in FIG. 7 and FIG. 8. The partial top schematic view shown in FIG. 6 is similar to the partial top schematic view shown in FIG. 1; thus, the same components recited in the above two embodiments could be reference to the above technical contents, and the technical content of the same arrangement regarding the components recited in the above two embodiments is omitted.

With reference to FIG. 6, the display panel 10A includes the substrate 100, the first isolation structure 110, the second isolation structure 120 and the light emitting structure 130. The first isolation structure 110 is located on the substrate 100 and has the plurality of through holes VIA. The first isolation structure 110 is the reticular structure and includes the first direction portion 112 extending along the first direction D1 and the second direction portion 114 extending along the second direction D2, wherein the second direction portion 114 of the first isolation structure 110 further has the plurality of through holes VIA. The second isolation structure 120 could be the banned structure arranging along the specific direction, which is laminated on the second direction portion 114 of the first isolation structure 110 and fills up the plurality of through holes VIA of the second direction portion 114. The plurality of light emitting structures 130 are disposed on the substrate 100 and are arranged in an array, and the plurality of light emitting structures 130 (for example, the light emitting structure 130A, the light emitting structure 130B and the light emitting structure 130C) are isolated from each other via the second isolation structure 120.

In FIG. 6 to FIG. 8, the difference between the display panel 10A according to the present embodiment and the embodiment shown in FIG. 1 is the width W2 of the second isolation structure 120 of the display panel 10A measured along the first direction D1 is larger than the width W1 of the second direction portion 114 of the first isolation structure 110 measured along the first direction D1. Therefore, the second isolation structure 120 could cover the side surface of the second direction portion 114 of the first isolation structure 110.

Figure 9:
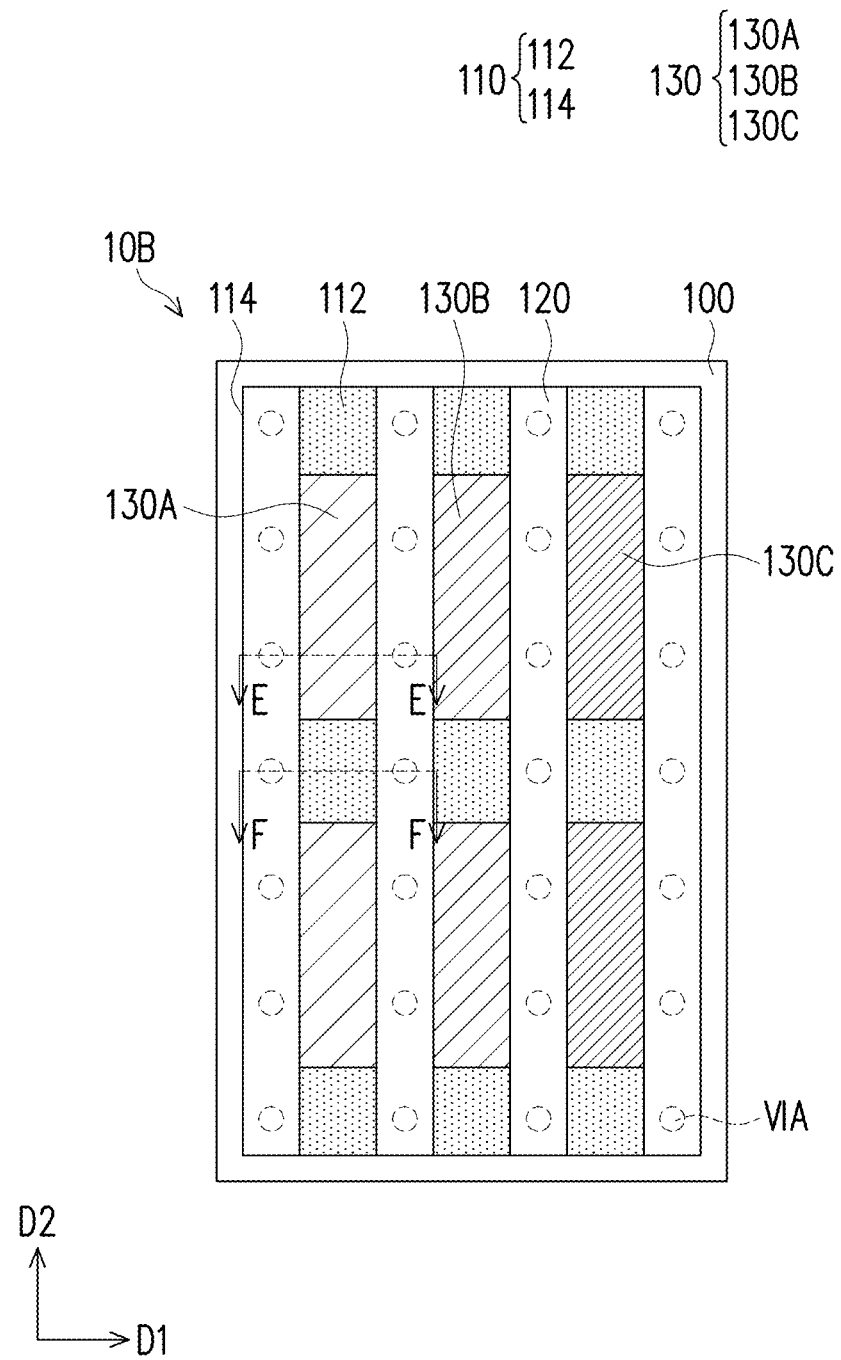
FIG. 9 is a partial top schematic view of a display panel according to another embodiment of the disclosure.
Figure 10:
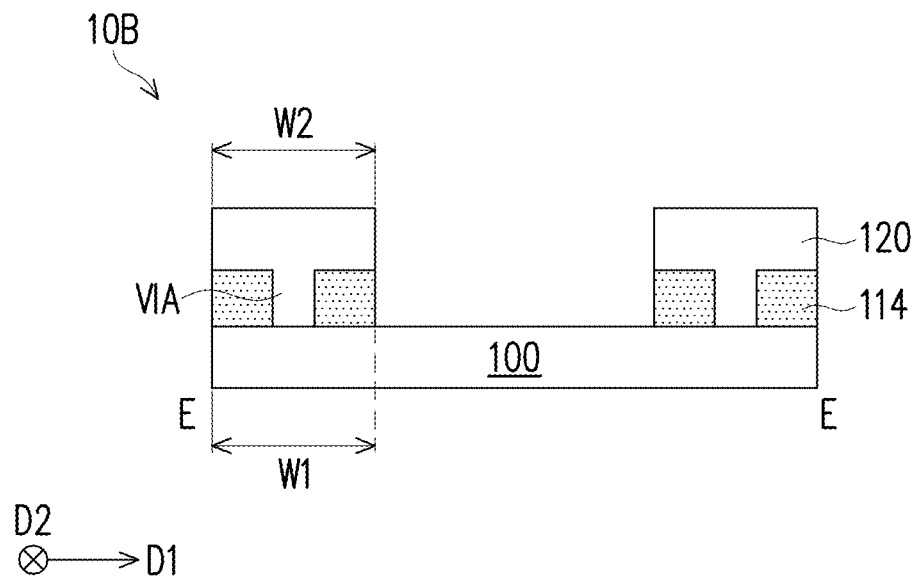
FIG. 10 is a cross-sectional view according to an embodiment of the display panel shown in FIG. 9 along a section-line E-E.
Figure 11:
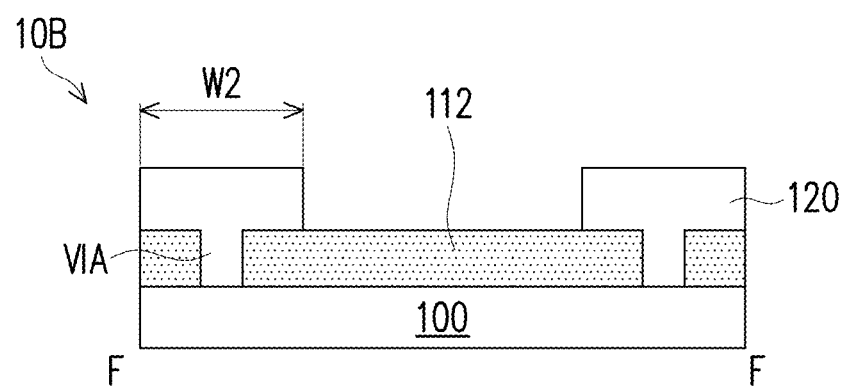
FIG. 11 is a cross-sectional view according to an embodiment of the display panel shown in FIG. 9 along a section-line F-F.

FIG. 9 is a partial top schematic view of a display panel 10B according to another embodiment of the disclosure. FIG. 10 is a cross-sectional view according to an embodiment of the display panel 10B shown in FIG. 9 along a section-line E-E. FIG. 11 is a cross-sectional view according to an embodiment of the display panel 10B shown in FIG. 9 along a section-line F-F. In order to clearly demonstrate the relationship between the components, there are only the first isolation structure, the second isolation structure, and the substrate shown in FIG. 10 and FIG. 11. The partial top schematic view shown in FIG. 9 is similar to the partial top schematic view shown in FIG. 1; thus, the same components recited in the above two embodiments could be reference to the above technical contents, and the technical content of the same arrangement regarding the components recited in the above two embodiments is omitted.

With reference to FIG. 9, the display panel 10B includes the substrate 100, the first isolation structure 110, the second isolation structure 120 and the light emitting structure 130. The first isolation structure 110 is located on the substrate 100 and has the plurality of through holes VIA. The first isolation structure 110 is the reticular structure and includes the first direction portion 112 extending along the first direction D1 and the second direction portion 114 extending along the second direction D2, wherein the second direction portion 114 of the first isolation structure 110 further has the plurality of through holes VIA. The second isolation structure 120 could be the banned structure arranging along the specific direction, which is laminated on the second direction portion 114 of the first isolation structure 110 and fills up the plurality of through holes VIA of the second direction portion 114. The plurality of light emitting structures 130 are disposed on the substrate 100 and are arranged in an array, and the plurality of light emitting structures 130 (for example, the light emitting structure 130A, the light emitting structure 130B and the light emitting structure 130C) are isolated from each other via the second isolation structure 120.

In FIG. 9 to FIG. 11, the difference between the display panel 10B according to the present embodiment and the embodiment shown in FIG. 1 is the width W2 of the second isolation structure 120 measured along the first direction D1 and the width W1 of the second direction portion 114 of the first isolation structure 110 measured along the first direction D1 are substantially the same. A side surface of the second isolation structure 120 could be substantially aligned with the side surface of the second direction portion 114 of the first isolation structure 110. Alternatively, the side surface of the second isolation structure 120 and the side surface of the second direction portion 114 of the first isolation structure 110 could substantially consist of a continuous inclined surface or a cambered surface.

Figure 12:
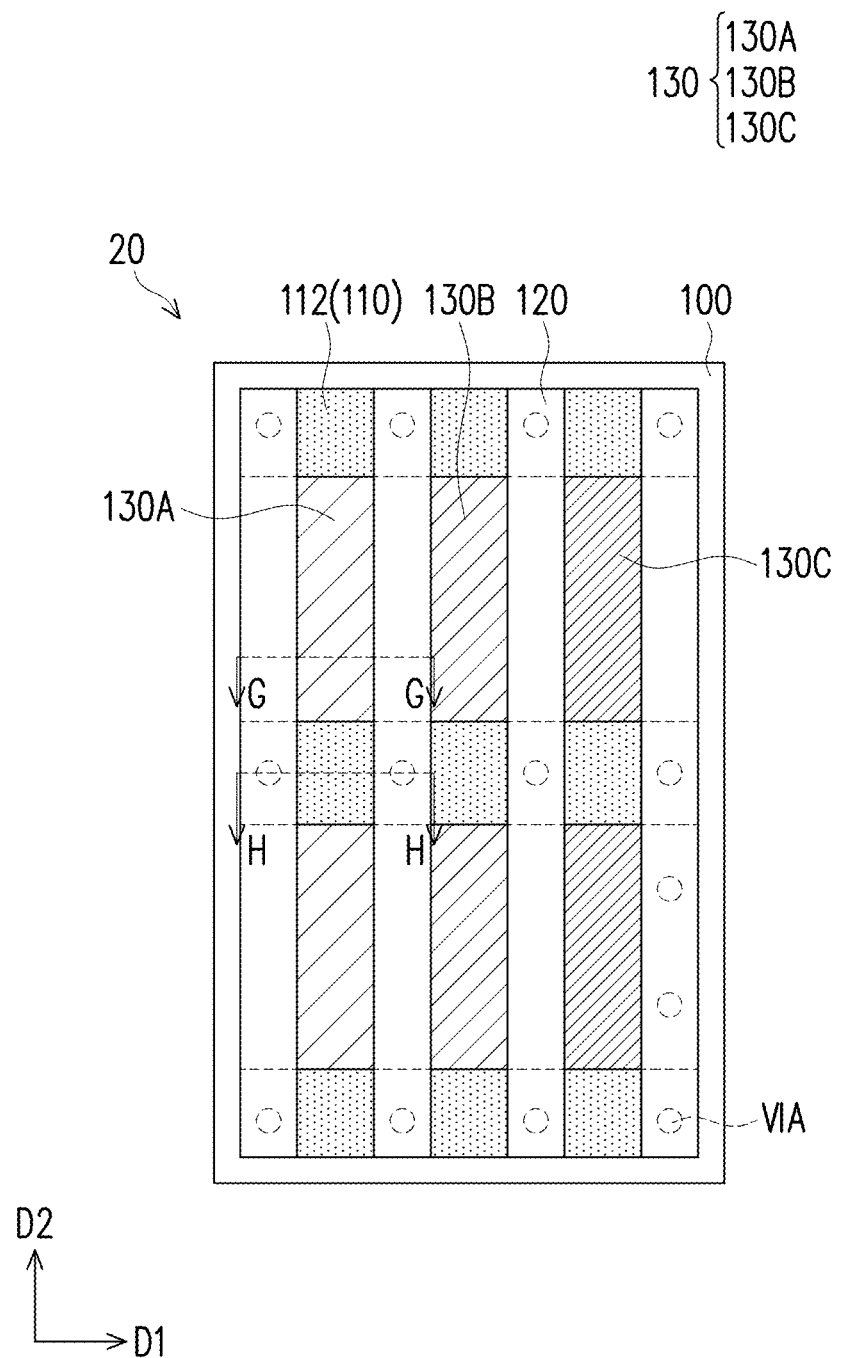
FIG. 12 is a partial top schematic view of a display panel according to another embodiment of the disclosure.
Figure 13:
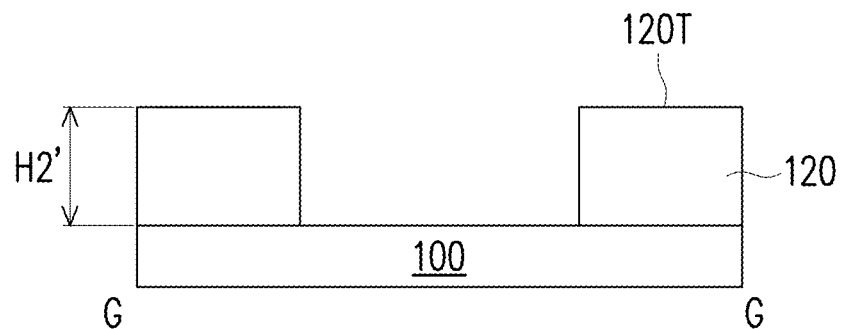
FIG. 13 is a cross-sectional view according to an embodiment of the display panel shown in FIG. 12 along a section-line G-G.
Figure 14:
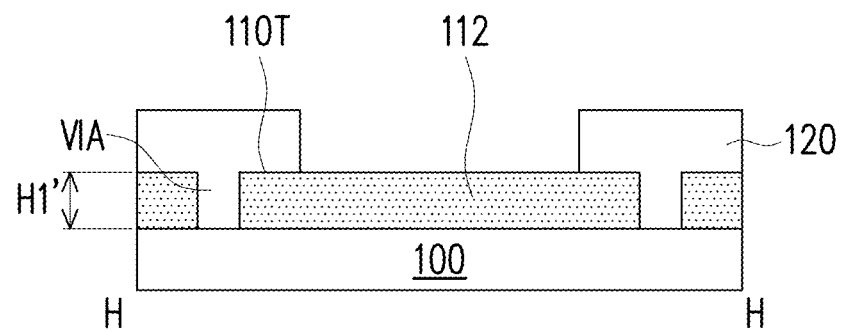
FIG. 14 is a cross-sectional view according to an embodiment of the display panel shown in FIG. 12 along a section-line H-H.

FIG. 12 is a partial top schematic view of a display panel 20 according to another embodiment of the disclosure. FIG. 13 is a cross-sectional view according to an embodiment of the display panel 20 shown in FIG. 12 along a section-line G-G. FIG. 14 is a cross-sectional view according to an embodiment of the display panel 20 shown in FIG. 12 along a section-line H-H. The display panel 20 shown in FIG. 12 is similar to the display panel 10 shown in FIG. 1; thus, the same components recited in the above two embodiments could be reference to the above technical contents, and the technical content of the same arrangement regarding the components recited in the above two embodiments is omitted. In order to clearly demonstrate the relationship between the components, there are only the first isolation structure, the second isolation structure, and the substrate shown in FIG. 13 and FIG. 14, while other components could be reference to the related description in FIG. 12. For example, the display panel 20 could include the data line DL, the scan line SL, the light emitting structure 130, and other components of the display panel 10 although they are not illustrated in FIG. 12 to FIG. 14.

With reference to FIG. 12, the display panel 20 includes the substrate 100, the first isolation structure 110, the second isolation structure 120 and the light emitting structure 130. The first isolation structure 110 is located on the substrate 100 and has the plurality of through holes VIA. The second isolation structure 120 is laminated on the first isolation structure 110 and fills up the plurality of through holes VIA. The plurality of light emitting structures 130 are disposed on the substrate 100 and are arranged in an array, and the plurality of light emitting structures 130 (for example, the light emitting structure 130A, the light emitting structure 130B and the light emitting structure 130C) are isolated from each other via the second isolation structure 120.

In FIG. 12 to FIG. 14, the difference between the display panel 20 according to the present embodiment and the embodiment shown in FIG. 1 is the first isolation structure 110 is the banned structure and only has the first direction portion 112 extending along the first direction D1. Namely, an extension direction (the first direction D1) of the first isolation structure 110 intersects an extension direction (the second direction D2) of the second isolation structure 120. The through hole VIA of the first isolation structure 110 is located at a position that the first isolation structure 110 intersects the second isolation structure 120, and the through hole VIA is filled with the second isolation structure 120 (as shown in FIG. 14); thus, the adhesion between the first isolation structure 110 as well as the second isolation structure 120 and the substrate 100 could be enhanced. In FIG. 13, a vertical distance H2' between the top surface 120T of the second isolation structure 120 and the substrate 100 is larger than a vertical distance H1' between the top surface 110T of the first isolation structure 110 and the substrate 100 (as illustrated in FIG. 14). A portion of the second isolation structure 120 could directly contact to the substrate 100 without the through hole VIA since the first isolation structure 110 does not include the second direction portion 114 extending along the first direction D1. A thickness (the vertical distance H2' between the top surface 120T of the second isolation structure 120 and the substrate 100) of the second isolation structure 120 could be larger than a thickness (the vertical distance H1' between the top surface 110T of the first isolation structure 110 and the substrate 100) of the first isolation structure 110. Therefore, the different light emitting structures 130 (for example, the light emitting structure 130A, the light emitting structure 130B and the light emitting structure 130C) arranging in the same row along the first direction D1 could be isolated from each other via the second isolation structure 120.

Figure 15:
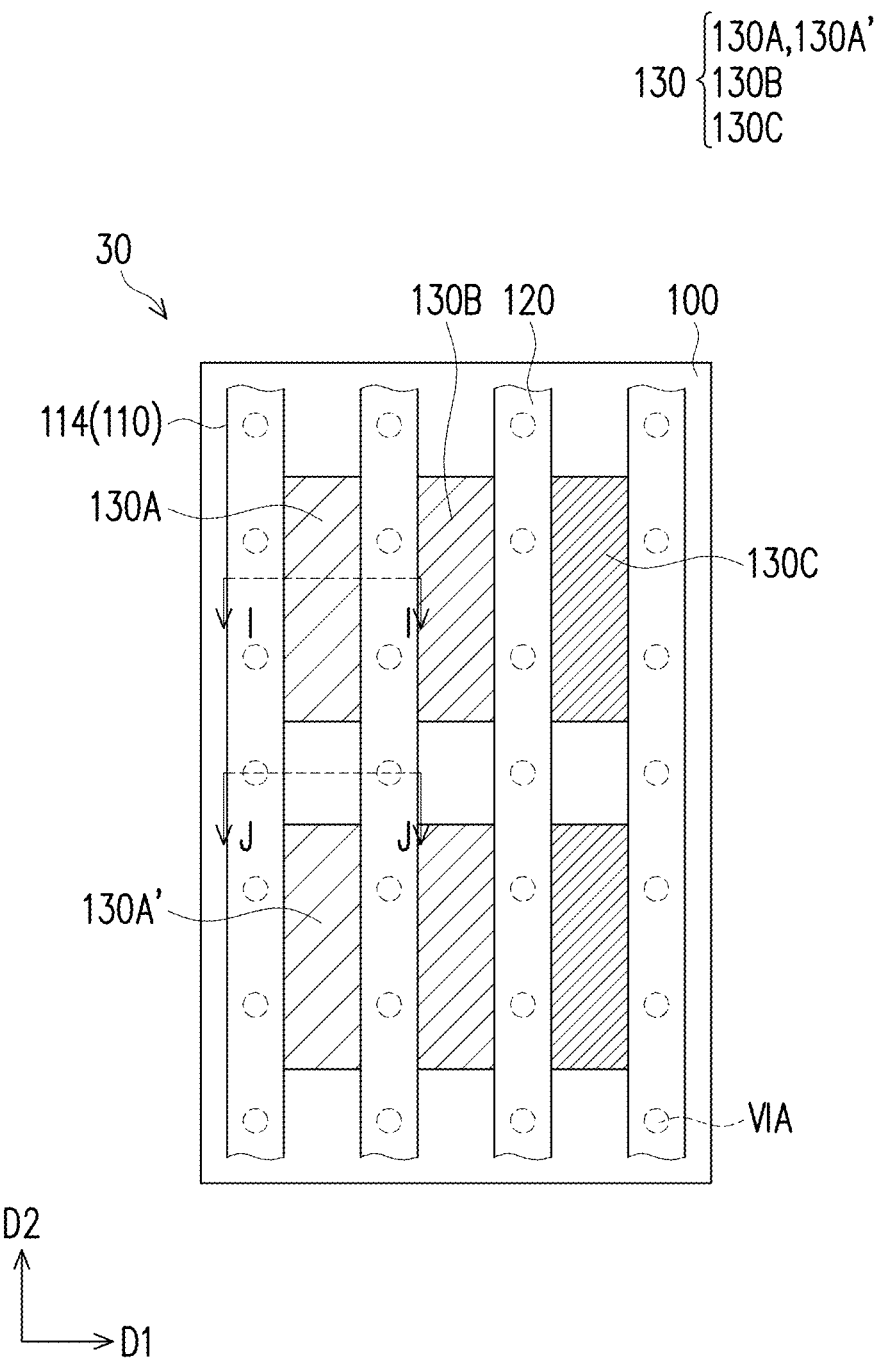
FIG. 15 is a partial top schematic view of a display panel according to another embodiment of the disclosure.
Figure 16:
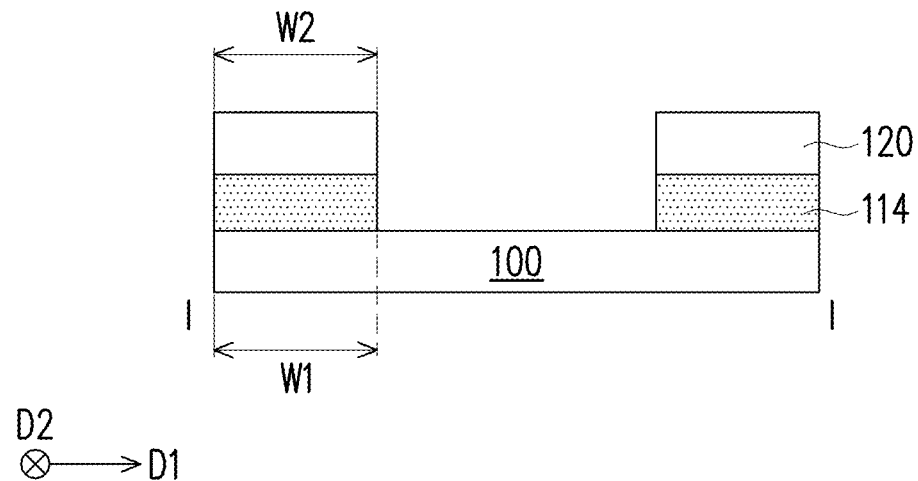
FIG. 16 is a cross-sectional view according to an embodiment of the display panel shown in FIG. 15 along a section-line I-I.
Figure 17:
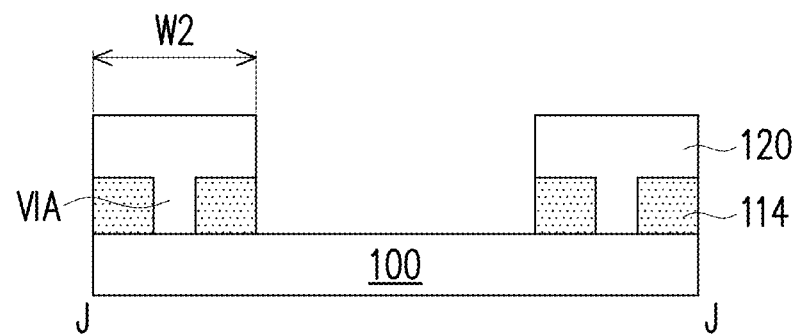
FIG. 17 is a cross-sectional view according to an embodiment of the display panel shown in FIG. 15 along a section-line J-J.

FIG. 15 is a partial top schematic view of a display panel 30 according to another embodiment of the disclosure. FIG. 16 is a cross-sectional view according to an embodiment of the display panel 30 shown in FIG. 15 along a section-line I-I. FIG. 17 is a cross-sectional view according to an embodiment of the display panel 30 shown in FIG. 15 along a section-line J-J. The display panel 30 shown in FIG. 15 is similar to the display panel 10 shown in FIG. 1; thus, the same components recited in the above two embodiments could be reference to the above technical contents, and the technical content of the same arrangement regarding the components recited in the above two embodiments is omitted. In order to clearly demonstrate the relationship between the components, there are only the first isolation structure, the second isolation structure, and the substrate shown in FIG. 16 and FIG. 17, while other components could be reference to the related description in FIG. 15.

With reference to FIG. 15, the display panel 30 includes the substrate 100, the first isolation structure 110, the second isolation structure 120 and the light emitting structure 130. The first isolation structure 110 is located on the substrate 100 and has the plurality of through holes VIA. The second isolation structure 120 is laminated on the first isolation structure 110 and fills up the plurality of through holes VIA. The plurality of light emitting structures 130 are disposed on the substrate 100 and are arranged in an array, and the plurality of light emitting structures 130 (for example, the light emitting structure 130A, the light emitting structure 130B and the light emitting structure 130C) are isolated from each other via the second isolation structure 120.

In FIG. 15 to FIG. 17, the difference between the display panel 30 according to the present embodiment and the embodiment shown in FIG. 1 is the first isolation structure 110 of the display panel 30 is the banned structure and only has the second direction portion 114 extending along the second direction D2. Namely, an extension direction (the second direction D2) of the first isolation structure 110 and an extension direction (the second direction D2) of the second isolation structure 120 are the same. Among them, the width W2 of the second isolation structure 120 measured along the first direction D1 could be smaller, larger, or the same as the width W1 of the first isolation structure 110 measured along the first direction D1, as illustrated in FIGS. 4, 5, 7, 8, 10, and 11; however, which should not be construed as a limitation in the disclosure.

As shown in FIG. 15, the neighbor light emitting structures 130 arranging in the same column along the second direction D2 (for example, the light emitting structure 130A and the light emitting structure 130A') are not isolated from each other via the first isolation structure 110, but they could still be separate light emitting structures 130, each of which respectively connects to the corresponding pixel circuit 102 (not shown). Since the light emitting structures 130 arranging in the same column along the second direction D2 (for example, the light emitting structure 130A and the light emitting structure 130A') could emit light with the same color, the problem of the defect of color mixing could not be generated even if the light emitting structure 130A and the light emitting structure 130A' are not isolated from each other via the first isolation structure 110.

Figure 18:
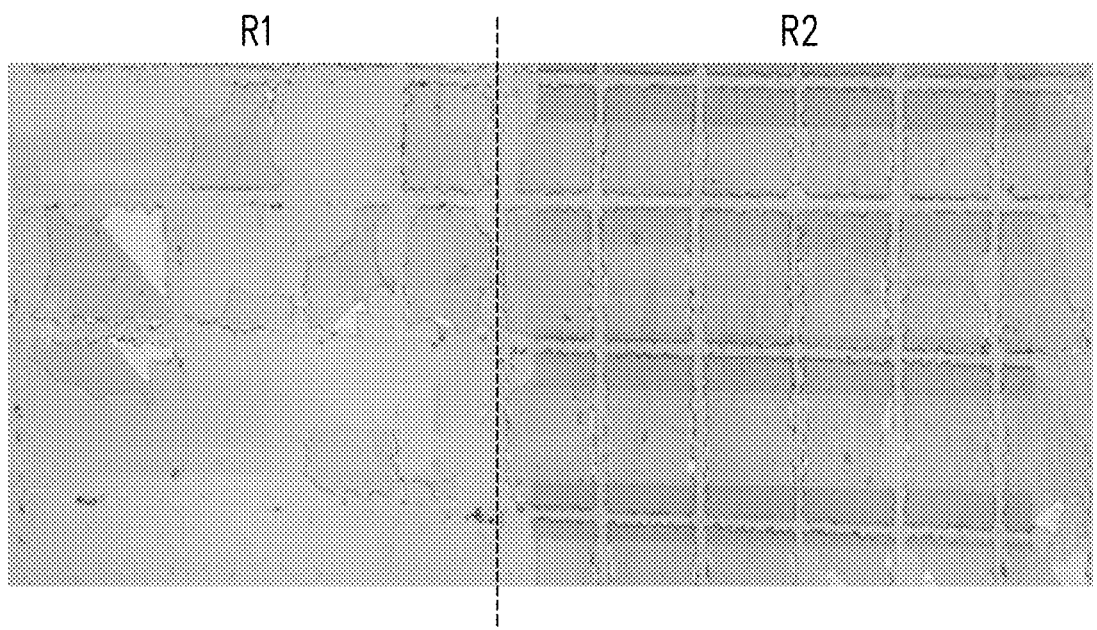
FIG. 18 is a measure result of an embodiment of the disclosure and a comparative example.

FIG. 18 is a measure result of an embodiment of the disclosure and a comparative example. As shown in FIG. 18, a region R1 at the left side divided by a dotted line is the measure result of the comparative example during an adhesion test, while a region R2 at the right side divided by the dotted line is the measure result of the embodiment of the disclosure during the adhesion test. There are the same materials and location pertaining the first isolation structure 110 and the second isolation structure 120 in the comparative example and the embodiment of the disclosure; that is, the first isolation structure 110 is disposed on a glass substrate, and the second isolation structure 120 is laminated on the first isolation structure 110. The difference between the comparative example and the embodiment of the disclosure is the first isolation structure 110 of the comparative example does not have the plurality of through holes VIA and the first isolation structure 110 of the embodiment of the disclosure has the plurality of through holes VIA filled with the second isolation structure 120. According to the measure result shown in FIG. 18, there are more peels in the region R1 compared to the region R2, while there is substantially no peel generated in the region R2. Based on the above performance, the first isolation structure 110 has the plurality of through holes VIA, and the second isolation structure 120 is laminated on the first isolation structure 110 and fills up the plurality of through holes VIA, so that the adhesion between the first isolation structure 110 as well as the second isolation structure 120 and the substrate 100 could be enhanced, thereby preventing the first isolation structure 110 and the second isolation structure 120 from being peeled from the substrate 100.

Based on the above, the display panel of the present disclosure provides the technical contents below: the first isolation structure has the plurality of through holes, and the second isolation structure is laminated on the first isolation structure and fills up the plurality of through holes. Therefore, the adhesion between the first isolation structure as well as the second isolation structure and the substrate could be enhanced, thereby preventing the first isolation structure and the second isolation structure from being peeled from the substrate.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. A display panel, comprising:
a substrate;
a first isolation structure, disposed on the substrate and has a plurality of through holes;
a second isolation structure, laminated on the first isolation structure and fills up the plurality of through holes of the first isolation structure, wherein a material of the second isolation structure includes an organic material; and
a plurality of light emitting structures, disposed on the substrate and are isolated from each other via the second isolation structure, wherein each of the plurality of light emitting structures comprises an anode disposed on the substrate, and the first isolation structure partially overlaps the anode and has a first opening exposing a surface of the corresponding anode.

2. The display panel according to claim 1, wherein a material of the first isolation structure includes an inorganic material or an organic material.

3. The display panel according to claim 1, wherein a width of the second isolation structure measured along a selected direction is larger than a width of the first isolation structure measured along the selected direction.

4. The display panel according to claim 3, wherein the second isolation structure covers a side surface of the first isolation structure.

5. The display panel according to claim 1, wherein a width of the second isolation structure measured along a selected direction is smaller than a width of the first isolation structure measured along the selected direction.

6. The display panel according to claim 1, wherein a width of the second isolation structure measured along a selected direction is the same as a width of the first isolation structure measured along the selected direction.

7. The display panel according to claim 1, wherein the first isolation structure extends along a first direction, the second isolation structure extends along a second direction, and the first direction intersects the second direction.

8. The display panel according to claim 1, wherein an extension direction of the first isolation structure is the same as an extension direction of the second isolation structure.

9. The display panel according to claim 1, wherein the first isolation structure includes a first direction portion extending along a first direction and a second direction portion extending along a second direction, the first direction intersects the second direction, and the plurality of through holes are disposed in the second direction portion.

10. The display panel according to claim 9, wherein the second isolation structure is laminated on the second direction portion and extends along the second direction.

11. The display panel according to claim 1, wherein a surface of the second isolation structure has hydrophobicity.

12. The display panel according to claim 1, wherein the plurality of through holes penetrate the first isolation structure.

13. The display panel according to claim 1, wherein the light emitting structure includes an organic light emitting laminated layer.

14. The display panel according to claim 1, wherein a top surface of the second isolation structure is farther away from the substrate compared to a top surface of the first isolation structure.

* * * * *